(12) United States Patent
Lin et al.

(10) Patent No.: US 12,543,348 B2
(45) Date of Patent: Feb. 3, 2026

(54) TRANSISTOR AND METHOD FOR MANUFACTURING THE SAME

(71) Applicant: Taiwan Semiconductor Manufacturing Company, Ltd., Hsinchu (TW)

(72) Inventors: Yu-Chu Lin, Tainan (TW); Wen-Chih Chiang, Hsinchu (TW); Chi-Chung Jen, Kaohsiung (TW); Ming-Hong Su, Tainan (TW); Mei-Chen Su, Kaohsiung (TW); Chia-Wei Lee, Kaohsiung (TW); Kuan-Wei Su, Kaohsiung (TW); Chia-Ming Pan, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/752,086

(22) Filed: Jun. 24, 2024

(65) Prior Publication Data

US 2024/0347645 A1 Oct. 17, 2024

Related U.S. Application Data

(62) Division of application No. 17/446,546, filed on Aug. 31, 2021, now Pat. No. 12,051,755.

(51) Int. Cl.
| | |
|---|---|
| *H10D 30/68* | (2025.01) |
| *G11C 16/04* | (2006.01) |
| *G11C 16/14* | (2006.01) |
| *G11C 16/26* | (2006.01) |
| *H10B 41/10* | (2023.01) |

(Continued)

(52) U.S. Cl.
CPC ......... *H10D 30/68* (2025.01); *G11C 16/0433* (2013.01); *G11C 16/14* (2013.01); *G11C 16/26* (2013.01); *H10B 41/10* (2023.02); *H10B 41/35* (2023.02); *H10B 41/70* (2023.02); *H10D 30/0411* (2025.01); *H10D 30/683* (2025.01);
(Continued)

(58) Field of Classification Search
None
See application file for complete search history.

(56) References Cited

U.S. PATENT DOCUMENTS

| | | |
|---|---|---|
| 2004/0065917 A1 | 4/2004 | Fan et al. |
| 2007/0257299 A1 | 11/2007 | Chen et al. |

(Continued)

*Primary Examiner* — Xiaoming Liu
(74) *Attorney, Agent, or Firm* — Harrity & Harrity, LLP

(57) ABSTRACT

Some implementations described herein provide a semiconductor structure. The semiconductor structure includes a first terminal coupled to a substrate of the semiconductor structure, with the first terminal including a first portion of a tunneling layer formed on the substrate, and a first gate formed on the first portion of the tunneling layer. The semiconductor structure includes a second terminal coupled to the substrate and adjacent to the first terminal, with the second terminal including a second portion of the tunneling layer formed on the substrate, a second gate formed on the second portion of the tunneling layer, and a dielectric structure formed on a top surface and side surfaces of the second gate. The semiconductor structure includes a third terminal coupled to an insulating structure and adjacent to the second terminal, with the third terminal including, a third gate formed on the insulating structure.

20 Claims, 13 Drawing Sheets

(51) Int. Cl.
*H10B 41/35* (2023.01)
*H10B 41/70* (2023.01)
*H10D 30/01* (2025.01)
*H10D 64/01* (2025.01)

(52) U.S. Cl.
CPC ....... *H10D 30/6892* (2025.01); *H10D 64/035* (2025.01)

(56) References Cited

U.S. PATENT DOCUMENTS

| | | | |
|---|---|---|---|
| 2009/0098721 A1* | 4/2009 | Liu | H10B 41/30 257/E21.294 |
| 2009/0294832 A1* | 12/2009 | Kakoschke | H10D 64/667 257/324 |
| 2015/0021679 A1 | 1/2015 | Tsair et al. | |
| 2015/0035040 A1 | 2/2015 | Yoo et al. | |
| 2016/0336415 A1* | 11/2016 | Wu | H10B 41/35 |
| 2018/0151581 A1* | 5/2018 | Wu | H10D 64/035 |
| 2023/0065897 A1 | 3/2023 | Lin et al. | |

* cited by examiner

TRANSISTOR AND METHOD FOR MANUFACTURING THE SAME

RELATED APPLICATION

This application is a continuation of U.S. patent application Ser. No. 17/446,546, filed Aug. 31, 2021, which is incorporated herein by reference in its entirety.

BACKGROUND

A transistor is a common type of semiconductor device in electronic devices that is able to amplify and/or switch electrical signals. A transistor may be configured with multiple terminals to receive one or more applications of voltage. A voltage applied to a first terminal associated with a gate may control a current across a second terminal associated with a source voltage and a third terminal associated with a drain voltage. The transistor may be configured to perform different operations based on applications of different combinations of voltages to the terminals. For example, the transistor may perform a programming operation, a read operation, or an erase operation when different combinations of voltages are applied to the terminals of the transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
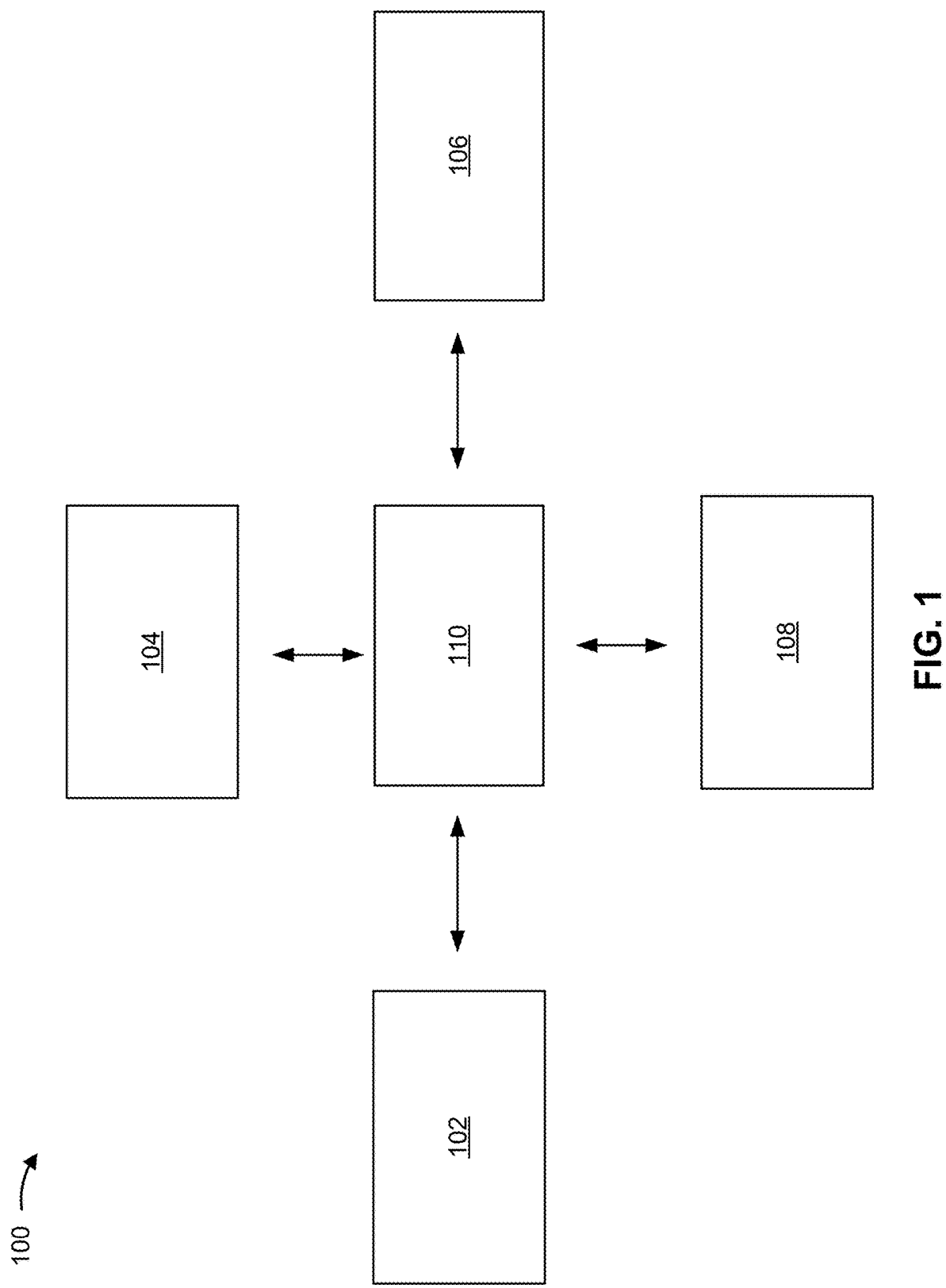
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor structure may include a gate structure that includes a control gate and a floating gate in a stacked configuration. Based on the gate structure being in a stacked configuration, the gate structure may extend to a height above a substrate of the semiconductor structure that is relatively high (e.g., in comparison with another device, such as a logic device disposed in a same level of the semiconductor structure). The height of the gate structure being relatively high may cause an increased likelihood of deterioration of a dielectric structure disposed between a top surface of the gate structure and an electrode that provides a voltage to the gate structure (e.g., based on a decreased thickness of the dielectric structure), which may cause shorting and/or other failures of the semiconductor structure. Additionally, or alternatively, the stacked configuration may provide a stress on a tunneling oxide material disposed between the gate structure and substrate of the semiconductor structure. This stress may be caused based on each transistor-based operation of the semiconductor structure (e.g., programming, reading, and erasing) being performed based on application of a voltage difference across the tunneling oxide material. The stress may cause deterioration of the tunneling oxide, shorting across the tunneling oxide, and/or another failure of the semiconductor structure.

Some implementations described herein provide techniques and apparatuses for a semiconductor structure that includes a transistor having a lateral configuration of gates. The semiconductor structure may include a substrate having a source/drain and/or an insulating structure disposed therein. The semiconductor structure may be configured with a set of terminals to couple components of the semiconductor structure to voltage sources. A first gate terminal may include a first portion of a tunneling layer, disposed on a lightly-doped drain portion of the substrate, and a first gate. A second gate terminal may include a second portion of the tunneling layer, a second gate, and a dielectric structure disposed on top and on sides of the second gate. A third gate terminal may include a third gate disposed on an insulating structure within, or on top of, the substrate. The dielectric structure may be disposed between the second gate and the first gate, and between the second gate and the third gate. Another terminal (e.g., a bit line (BL) terminal) may be disposed with an electrical connection to the source/drain.

Based on the semiconductor structure having gates arranged laterally (e.g., instead of in a stacked configuration), the gates may have heights that are relatively low in comparison with gates in a stacked configuration. Based on the gates having heights that are relatively low, the semiconductor structure may have a reduced likelihood of deterioration of a dielectric structure disposed between a top surface of the gates and electrodes that provide voltages to the gate structures (e.g., based on an increased thickness of the dielectric structure), which may reduce a likelihood of shorting and/or other failures of the semiconductor structure.

Additionally, or alternatively, the gates having heights that are relatively low may improve deposition processes (e.g., reduce errors, cost, and/or cycle times) based on the gates having a same or similar height as other single-layer devices within the semiconductor structure (e.g., a logic device using a same material as the gates). This may facilitate a reduced number of deposition operations to deposit material of the gates for various devices of the semiconductor structure. Further, based on the gates being arranged laterally with different terminals, the semiconductor structure may be configured to perform one or more operations based on providing a voltage difference across the dielectric structure, instead of based on providing a voltage difference across the tunneling oxide. This may reduce stress on the tunneling oxide, which may increase a life cycle of the semiconductor structure.

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a chemical-mechanical polishing (CMP) tool, and/or an ion implantation tool 108. The plurality of semiconductor processing tools 102-108 included in example environment 100 may be included in a semiconductor clean room, a semiconductor foundry, a semiconductor processing and/or manufacturing facility, and/or the like.

Deposition tool 102 is a semiconductor processing tool that is capable of depositing various types of materials onto a substrate. In some implementations, deposition tool 102 includes a spin coating tool that is capable of depositing a photoresist layer on a substrate such as a wafer. In some implementations, deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, deposition tool 102 includes a physical vapor deposition (PVD) tool, such as a sputtering tool or another type of PVD tool. In some implementations, the example environment 100 includes a plurality of types of deposition tools 102.

Etching tool 104 is a semiconductor processing tool that is capable of etching various types of materials of a substrate, wafer, or semiconductor device. For example, etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of a the substrate using a sputtering technique, a plasma-assisted etch technique (e.g., a plasma sputtering technique or another type of technique involving the use of an ionized gas to isotropically or directionally etch the one or more portions), or another type of dry etching technique.

CMP tool 106 is a semiconductor processing tool that is capable of polishing or planarizing various layers of a wafer or semiconductor device. For example, CMP tool 106 may be configured to polish or planarize a layer or surface of deposited or plated material. CMP tool 106 may polish or planarize a surface of a semiconductor device with a combination of chemical and mechanical forces (e.g., chemical etching and free abrasive polishing). CMP tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

An ion implantation tool 108 is a semiconductor processing tool that is used to implant ions into a substrate such as a semiconductor wafer. The ion implantation tool 108 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. The ion beam may be directed toward the substrate such that the ions are implanted below the surface of the substrate to dope the substrate.

Wafer/die transport tool 110 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-108 and/or to and from other locations such as a wafer rack, a storage room, and/or the like. In some implementations, wafer/die transport tool 110 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
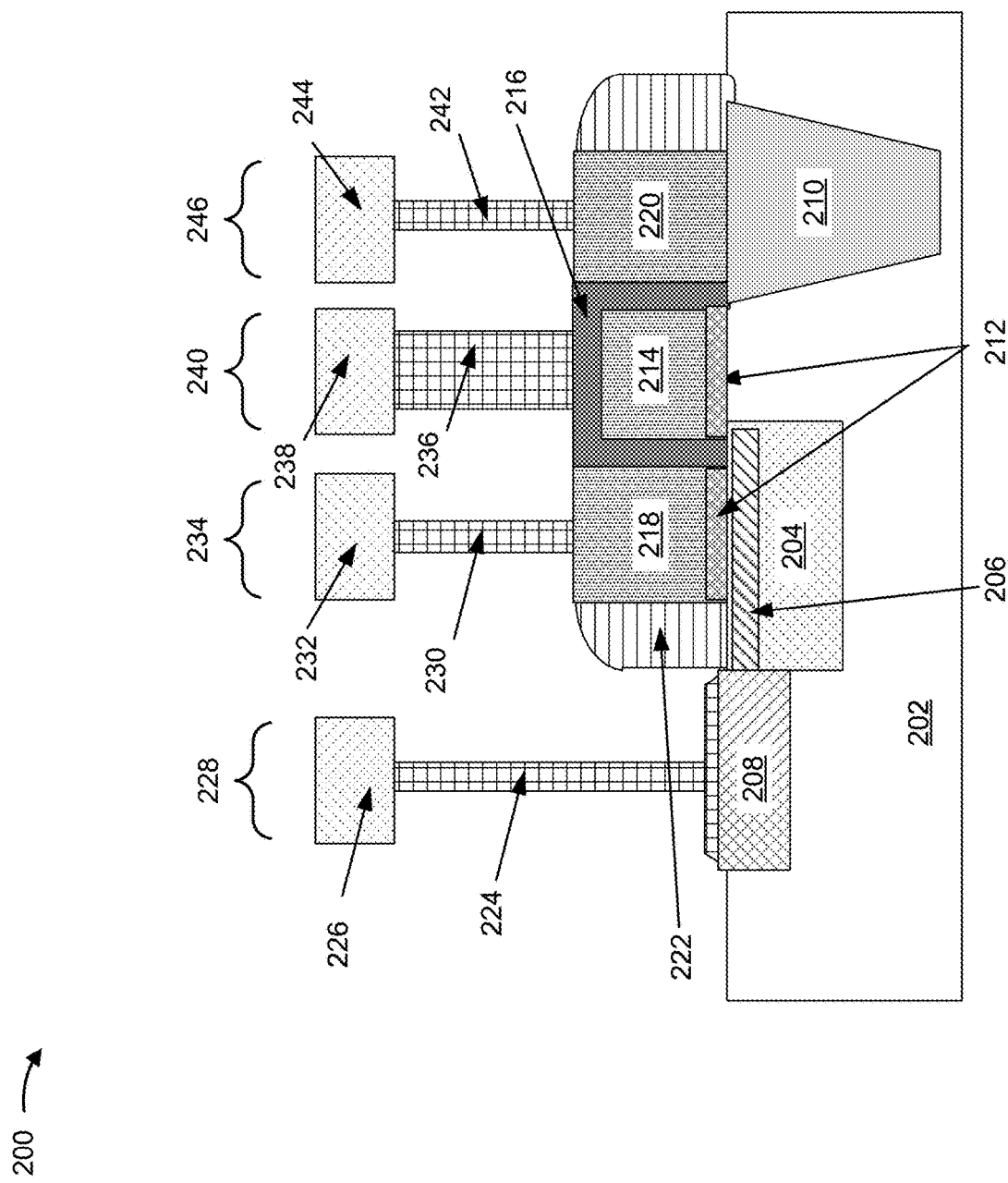
FIG. 2 is a diagram of an example semiconductor structure described herein.

FIG. 2 is a diagram of an example semiconductor structure 200 described herein. In some implementations, the semiconductor structure 200 includes one or more layers not shown in FIG. 2, such as one or more barrier layers, adhesion layers, metal gates, substrates, interconnects, recesses (e.g., vias), or dielectric structures, among other examples.

As shown in FIG. 2, the semiconductor structure 200 may include a substrate 202. In some implementations, the substrate 202 includes a silicon-based material (e.g., $SiO_2$ or silicon carbide, among other examples). The substrate 202 may include a doped portion 204, a lightly doped drain (LDD) portion 206, a source/drain 208 (e.g., a n-type dope portion of the substrate), and an insulating structure 210. In some aspects, one or more portions of the substrate 202, or structures within the substrate (e.g., the insulating structure 210) may be disposed fully within the substrate or may be at least partially extend above a top surface of the substrate 202.

In some implementations, the doped portion 204 may be doped with a p-type doping (e.g., using ion implantation tool 108). The doped portion 204 may include a doped silicon material that has an increased conductivity (e.g., electrical conductivity) in comparison with other portions of the substrate 202. In some implementations, the doped portion 204 may be configured to create a conducting path between the source/drain 208 and another terminal (e.g., terminal 240) of the semiconductor structure. In some implementations, a threshold voltage (Vt) may be needed to conduct (e.g., electrically) through the doped portion 204 between the source/drain and another terminal of the semiconductor structure 200.

In some implementations, the LDD portion 206 may be disposed above the doped portion 204. The LDD portion 206 may be doped with an n-type doping (e.g., using ion implantation tool 108). The LDD portion 206 may include a doped silicon material that has an increased conductivity (e.g., electrical conductivity) in comparison with other portions of the substrate 202, but less lower conductivity than the doped portion 204. The LDD portion 206 may improve parasitic capacitance between one or more gates of the semiconductor structure 200 and/or with the substrate (e.g., the doped portion 204). Additionally, or alternatively, the LDD portion 206 may reduce a likelihood of generating a hot electron effect that may otherwise be caused based on the doped portion 204 being disposed below a gate of the semiconductor structure 200.

In some implementations, the insulating structure 210 may be disposed within a recess of the substrate 202. For example, the insulating structure 210 may include a deep trench isolation (DTI) structure or a shallow trench isolation (STI), among other examples. The insulating structure 210 may have a depth in a range of approximately 3,000 angstroms to 4,350 angstroms (e.g., depending on a material used in the insulating structure 210) to provide sufficient insulation to prevent, or substantially prevent, current and/or charging effects between the substrate 202 and a structure above the insulating structure 210 (e.g., a conductive structure 220) and/or between portions of the substrate on opposite sides of the insulating structure 210. In some implementations, the insulating structure 210 may be disposed on a top surface of the substrate 202 or with at least a portion of the insulating structure 210 extending above the top surface of the substrate 202. The insulating structure 210 may include an insulating material, such as silicon oxide or silicon dioxide, among other examples.

The semiconductor structure 200 may include a tunneling layer 212 disposed on a top surface of the substrate 202. The tunneling layer 212 may include an oxide-based material (e.g., a tunneling oxide material, such as a silicon oxide material and/or aluminum oxide material). The tunneling layer 212 may support voltage interactions (e.g., capacitance and/or charging, among other examples) between the substrate and a gate above the tunneling layer 212 and may reduce current between the substrate 202 and the gate above the tunneling layer 212.

The semiconductor structure 200 may include a conductive structure 214 formed (e.g., disposed) on a first portion of the tunneling layer 212. In some implementations, the conductive structure 214 may include a gate, such as a metal gate or a polysilicon-based gate (e.g., having polysilicon-material). In some implementations, the conductive structure 214 may have a thickness (e.g., a height) that is greater than approximately 800 angstroms. For example, the conductive structure 214 may have a thickness that is in a range of approximately 800 angstroms to approximately 1,000 angstroms. In this way, a side surface of the conductive structure 214 may be sufficiently tall to couple to another conductive structure (e.g., conductive structure 218 and/or conductive structure 220) during operations of the semiconductor structure 200. In some implementations, the conductive structure 214 may have a width (e.g., a critical dimension) that is in a range of approximately 75 angstroms to approximately 95 angstroms. Based on having a width that is less than approximately 95 angstroms, the semiconductor structure 200 may have an improved device density and/or may support a short enough distance between terminals of the semiconductor structure 200 to perform operations with a sufficiently low voltage requirement to avoid unnecessary consumption of power resources.

The semiconductor structure 200 may include a dielectric structure 216 disposed on side surfaces and/or a top surface of the conductive structure 214. Additionally, or alternatively, a bottom surface of a portion of the dielectric structure 216 may be disposed on the insulating structure 210. In this way, a structure disposed on a surface of the insulating structure 210 (e.g., conductive structure 220) may be insulated from the substrate 202.

In some implementations, the dielectric structure 216 may be disposed on all side surfaces of the conductive structure 214. The dielectric structure 216 may include a single layer of material or multiple layers of material. For example, the dielectric structure 216 may include an oxide-nitride-oxide (ONO) structure having a first oxide-based layer, a silicon nitride-based layer disposed on the first oxide-based layer, and a second oxide-based layer disposed on the silicon-nitride based layer. The ONO structure may be formed with thicknesses of layers such that a total thickness of the two oxide layers may be between 100% and 150% of a thickness of the nitride layer to improve dielectric characteristics of the dielectric structure. In some implementations, the nitride layer may include a range of approximately 5%-15% of concentration of nitrogen in the nitride layer. The dielectric structure 216 may have a thickness in a range of approximately 100 angstroms to 160 angstroms. In this way, the dielectric structure 216 may be sufficiently thick to resist current between the conductive structure 214 and other conductive structures, and may be sufficiently thin to allow for charging effects (e.g., capacitance) across the dielectric structure 216.

The semiconductor structure 200 may include a conductive structure 218 disposed on a second portion of the tunneling layer 212 and a conductive structure 220 disposed on the insulating structure 210. In some implementations, the conductive structures 218 and/or 220 may include a gate, such as a metal gate or a polysilicon-based gate (e.g., having polysilicon-material). In some implementations, the conductive structures 218 and/or 220 may have thicknesses (e.g., heights) that are greater than a thickness of the conductive structure 214. In some implementations, the conductive structures 218 and/or 220 may have thicknesses such that the first conductive structure 218, the third conductive structure 220, and a top portion of the dielectric structure 216 extend to approximately a same height relative to a top surface of the substrate 202 of the semiconductor structure 200. For example, the conductive structures 218 and/or 220 may have thicknesses in a range from approximately 900 angstroms to approximately 1,160 angstroms. In this way, side surfaces of the conductive structures 218 and/or 220 may be sufficiently tall to couple to the conductive structure 214 during operations of the semiconductor structure 200. In some implementations, the conductive structures 218 and 220 may have widths (e.g., a critical dimension) that are in a range of approximately 75 angstroms to approximately 95 angstroms. Based on having width that are less than approximately 95 angstroms, the semiconductor structure 200 may have an improved device density and/or may support a short enough distance between terminals of the semiconductor structure 200 to perform operations with a sufficiently low voltage requirement to avoid unnecessary consumption of power resources.

In some implementations, a distance from the conductive structure 218 to a nearest source/drain 208 of the semiconductor structure 200 may be less than a distance from the conductive structure 214 to a nearest source/drain 208 of the semiconductor structure 200. In other words, the conductive structure 218 may be positioned between the nearest source/drain 208 and the conductive structure 214.

In some implementations, the insulating structure 210 may be configured to provide an electrical resistance between the third conductive structure 220 and the substrate 202 that is greater that an electrical resistance provided by the dielectric structure 216 between the second conductive structure 214 and the third conductive structure 220. In this way, the conductive structure 220 may interact electrically (e.g., provide a charging and/or capacitive function) with the conductive structure 214 without, or substantially without, interacting electrically with the substrate 202.

The semiconductor structure 200 may include one or more spacers 222 that provide structural support, an electromigration barrier, and/or electrical insulation (e.g., to prevent write disturbance and/or reverse tunneling) to the conductive structures 214, 218, and/or 220. In some aspects, the one or more spacers 222 may include a silicon-based material, such as a silicon nitride material.

The semiconductor structure 200 may include conductive structures 224, 230, 236, and/or 242 to provide electrical connections to components of the semiconductor structure 200. The conductive structures 224, 230, 236, and/or 242 may include a conductive material, such as copper, tungsten, ruthenium, titanium, tantalum, and/or a silicide-based material. The conductive structure 224 may provide an electrical connection to the source/drain 208. The conductive structure 230 may provide an electrical connection to the conductive structure 218. The conductive structure 236 may provide an electrical connection to the dielectric structure 216 at a top surface of the conductive structure 214 (e.g., to provide a charge to the conductive structure 214). The conductive structure 242 may provide an electrical connection to the conductive structure 218. In some implementations, the conductive structure 236 may have a width that is greater than a width of the conductive structure 230 and a width of the conductive structure 242. The conductive structure 236 may have a greater width to provide an improved coupling ratio to the conductive structure 214 to compensate for the dielectric structure 216 being disposed between the conductive structure 236 and the conductive structure 214.

The semiconductor structure 200 may include conductive structures (electrodes) 226, 232, 238, and/or 244 that are configured to couple components of the semiconductor structure 200 to voltage sources. The conductive structures 226, 232, 238, and/or 244 may include a conductive material, such as copper. The conductive structure 226 may be configured to couple the conductive structure 224 to a first voltage source, the conductive structure 232 may be configured to couple the conductive structure 230 to a second voltage source, the conductive structure 238 may be configured to couple the conductive structure 236 to a third voltage source, and/or the conductive structure 244 may be configured to couple the conductive structure 242 to a fourth voltage source.

Components of the semiconductor structure 200 may be referred to as terminals of the semiconductor structure. A terminal 228 (e.g., a bit line terminal) may include the conductive structure 226 and the conductive structure 224 coupled to the source/drain 208. A terminal 234 (e.g., an access gate terminal) may include the conductive structure 232, the conductive structure 230, the conductive structure 218, and the tunneling layer 212 formed on the substrate 202. A terminal 240 (e.g., a control gate terminal) may include the conductive structure 236, the dielectric structure 216, the conductive structure 214, and the tunneling layer 212 formed on the substrate 202. A terminal 246 (e.g., an erase gate terminal) may include the conductive structure 244, the conductive structure 242, and the conductive structure 220 formed on the insulating structure 210.

The semiconductor structure 200 may be configured to perform a programming operation based on (e.g., when) a voltage applied to the terminal 234 is less than a voltage applied to the terminal 240 and a voltage applied to the terminal 246 is less than the voltage applied to the terminal 240. In some implementations, the semiconductor structure 200 may be configured to perform a programming operation based on a voltage difference between the conductive structure 214 (e.g., terminal 240) and the source/drain 208 (e.g., the terminal 228) is greater than a voltage difference between the conductive structure 218 (e.g., terminal 234) and the source/drain 208 and is greater than a voltage difference between the conductive structure 220 and the source/drain 208. For example, the semiconductor structure 200 may perform a programming operation based on application of a voltage of approximately −2 microvolts (e.g., 0 volts) to the terminal 228, a voltage of approximately 1.3 volts applied to the terminal 234, a voltage of approximately 8.7 volts applied to the terminal 240, and a voltage of approximately 4 volts applied to the terminal 246.

The semiconductor structure 200 may be configured to perform an erasing operation based on (e.g., when) a voltage applied to the terminal 234 and a voltage applied to the terminal 240 is less than a voltage applied to the terminal 246. In some implementations, the semiconductor structure 200 may be configured to perform an erasing operation based on a voltage difference between the conductive structure 214 (e.g., the terminal 240) and the conductive structure 220 (e.g., terminal 246) being greater than a voltage difference between the conductive structure 214 (e.g., the terminal 240) and the conductive structure 218 (e.g., terminal 234). For example, the semiconductor structure 200 may perform an erasing operation based on application of a voltage of approximately 0 volts to the terminal 228, a voltage of approximately 0 volts applied to the terminal 234, a voltage of approximately 0 volts applied to the terminal 240, and a voltage of approximately 10.5 volts applied to the terminal 246.

The semiconductor structure 200 may be configured to perform a read operation based on (e.g., when) a voltage applied to the terminal 228, a voltage applied to the terminal 240, and a voltage applied to the terminal 246 being approximately the same voltage (e.g., 0 volts). The semiconductor structure 200 may read a voltage of the terminal 234 to determine a value stored by the semiconductor structure 200.

As indicated above, FIG. 2 is provided as examples. Other examples may differ from what is described with regard to FIG. 2.

FIGS. 3A-3H are diagrams of an example implementation 300 described herein. Example implementation 300 may be an example process for forming the semiconductor structure 200. The semiconductor structure 200 may include a transistor and/or a flash memory device. FIGS. 3A-3H include a top view 302, a Y cross-section view 304, and an X cross-section view 306 of the semiconductor structure 200. The semiconductor structure 200 may include one or more additional devices, structures, and/or layers not shown in FIGS. 3A-3H.

Figure 3A:
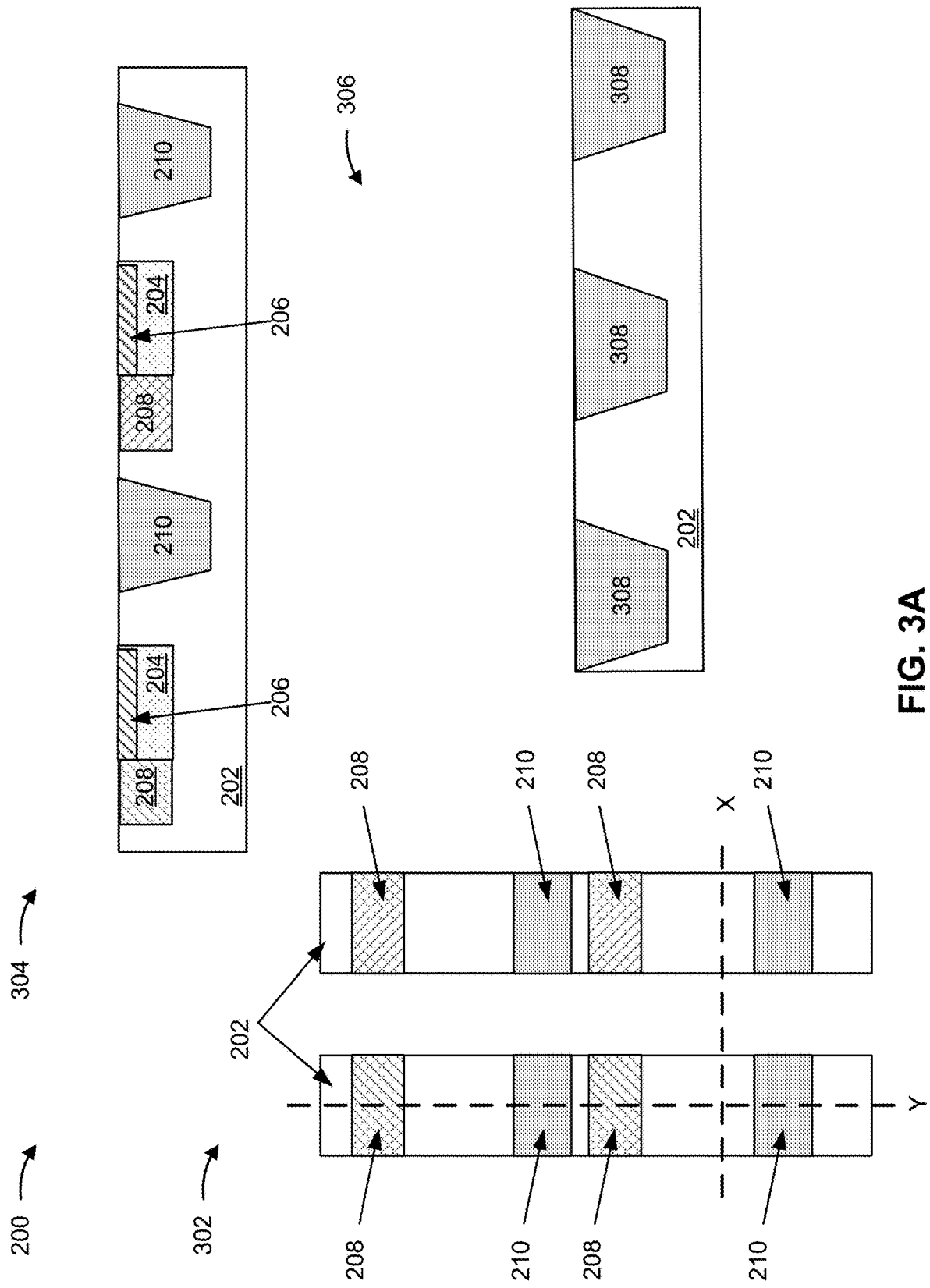
FIGS. 3A-3H are diagrams of an example implementation described herein.

As shown in FIG. 3A, example implementation 300 may include forming a substrate 202 having a doped portion 204, an LDD portion 206 disposed on a top portion of the doped portion 204, a source/drain 208, and an insulating structure 210. In some implementations, an ion implantation tool (e.g., ion implantation tool 108) may dope one or more portions of the substrate 202 to form the doped portion 204, the LDD portion 206, and/or the source/drain 208. In some implementations, the ion implantation tool may use n-doping (e.g., with phosphorus) or p-doping (e.g., with boron) to increase conductivity of portions of the substrate 202.

In some implementations, an etching tool (e.g., etching tool 104) may etch a portion of the substrate 202 to form a recess in which the insulating structure 210 may be formed. In some implementations, a deposition tool (e.g., deposition tool 102) may deposit the insulating structure 210 within the recess. In some implementations, a planarization tool (e.g., planarization tool 106) may polish and/or planarize upper surfaces of the substrate 202 and/or the insulating structure 210. In some implementations, the insulating structure 210 may provide insulation within the substrate 202 between sets of terminals (e.g., a transistor) of the semiconductor structure.

In some implementations, an etching tool (e.g., etching tool 104) may similarly etch a portion of the substrate 202 to form a recess in which a trench isolation structure 308 (e.g., a deep trench isolation structure) may be formed. In some implementations, a deposition tool (e.g., deposition tool 102) may deposit the trench isolation structure 308 within the recess. In some implementations, a planarization tool (e.g., planarization tool 106) may polish and/or planarize upper surfaces of the substrate 202 and/or the trench isolation structure 308. In some implementations, the trench isolation structure 308 may provide insulation within the substrate 202 between sets of devices (e.g., sets of transistors and/or logic devices in a row) of the semiconductor structure.

Figure 3B:
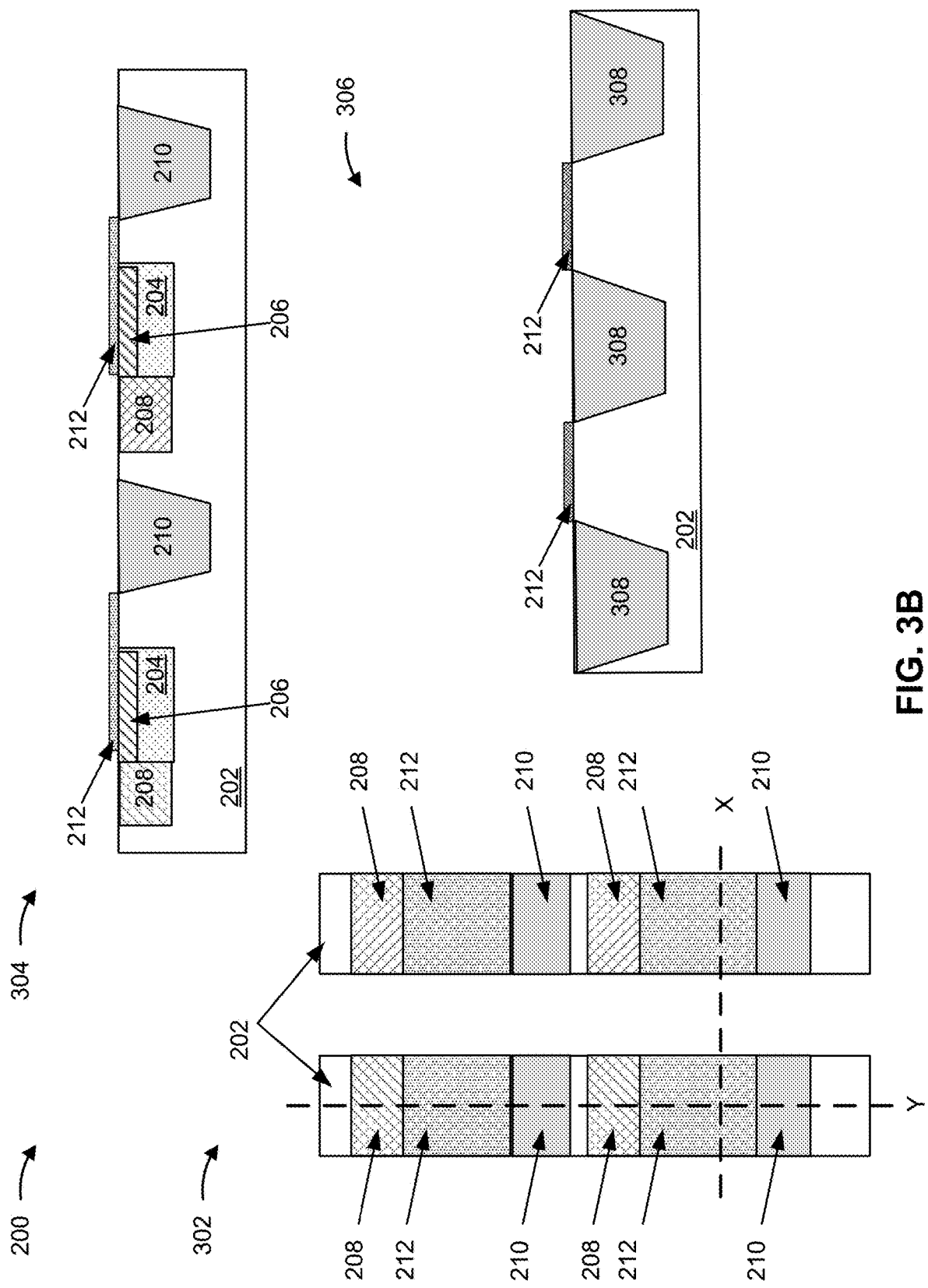

As shown in FIG. 3B, example implementation 300 may include forming a tunneling layer 212 (e.g., a tunneling oxide) on the substrate 202 of the semiconductor structure 200. In some implementations, a deposition tool (e.g., deposition tool 102) may deposit the tunneling layer 212 on the substrate 202. The deposition tool may deposit the tunneling layer 212 to provide an electrically insulating layer, or a partially electrically insulating layer, between the substrate 202 and structures above the tunneling layer 212.

Figure 3C:
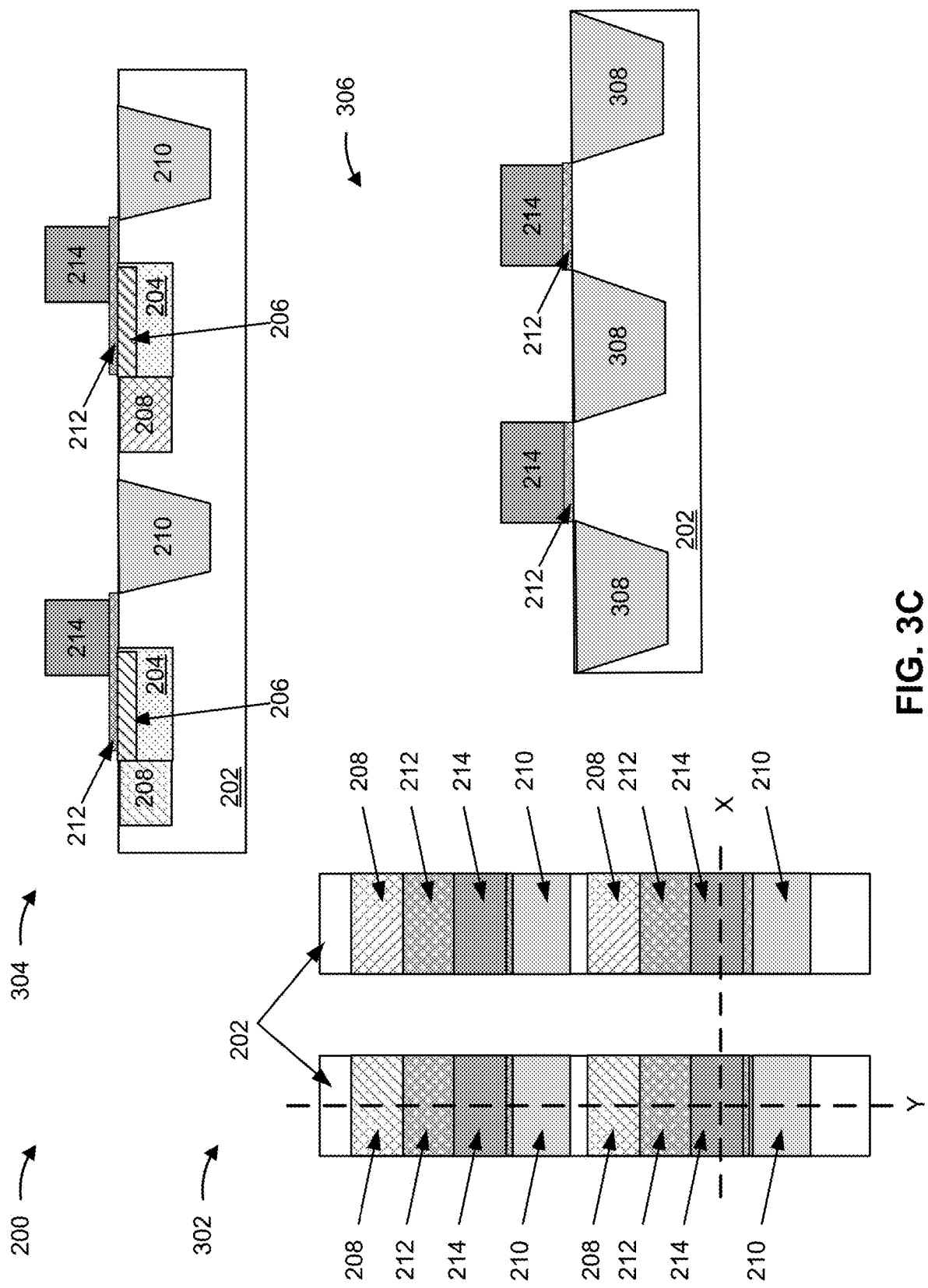

As shown in FIG. 3C, example implementation 300 may include forming a conductive structure 214 (e.g., a gate) on a portion of the tunneling layer 212. In some implementations, a deposition tool (e.g., deposition tool 102) may deposit the conductive structure 214 on the tunneling layer 212. The deposition tool may deposit the conductive structure 214 to provide a conductive material that may store charge and/or may be configured with a voltage for operations of the semiconductor structure 200. In some implementations, a planarization tool (e.g., planarization tool 106) may polish and/or planarize a top surface of the conductive structure 214 during a deposition process.

Figure 3D:
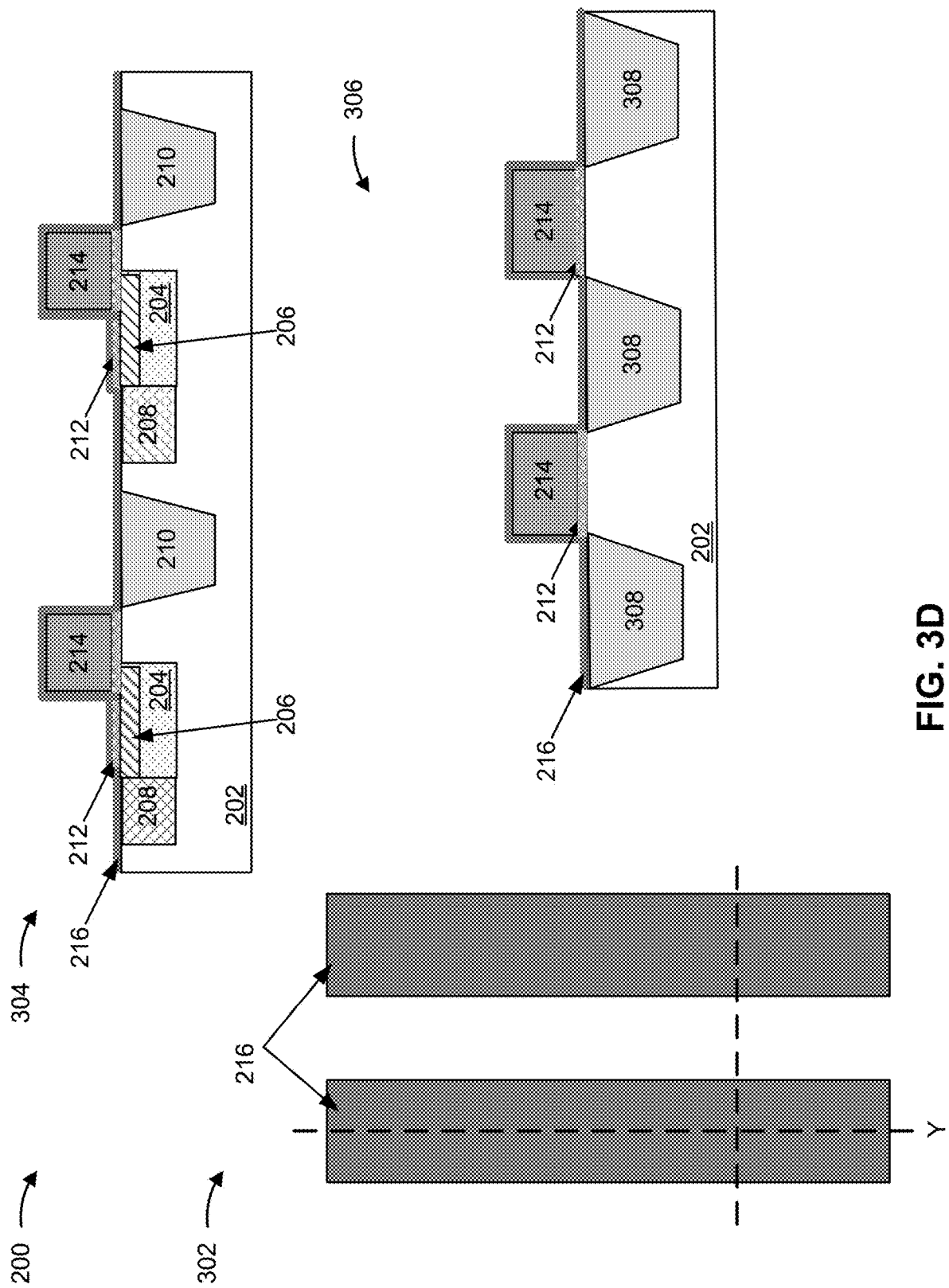

As shown in FIG. 3D, example implementation 300 may include forming a dielectric structure 216 (e.g., a tunneling oxide) on the substrate 202 and/or on the conductive structure 214 of the semiconductor structure 200. In some implementations, a deposition tool (e.g., deposition tool 102) may deposit the dielectric structure 216 on the substrate 202 and/or on the conductive structure 214. The deposition tool may deposit the dielectric structure 216 to provide an electrically insulating layer, or a partially electrically insulating layer, between the substrate 202 and/or on the conductive structure 214 and structures above the dielectric structure 216. A process of depositing the dielectric structure 216 may include multiple deposition processes, such as depositing a first layer (e.g., a first oxide-based layer), depositing a second layer (e.g., a nitride-based layer), and/or depositing a third layer (e.g., a second oxide-based layer).

Figure 3E:
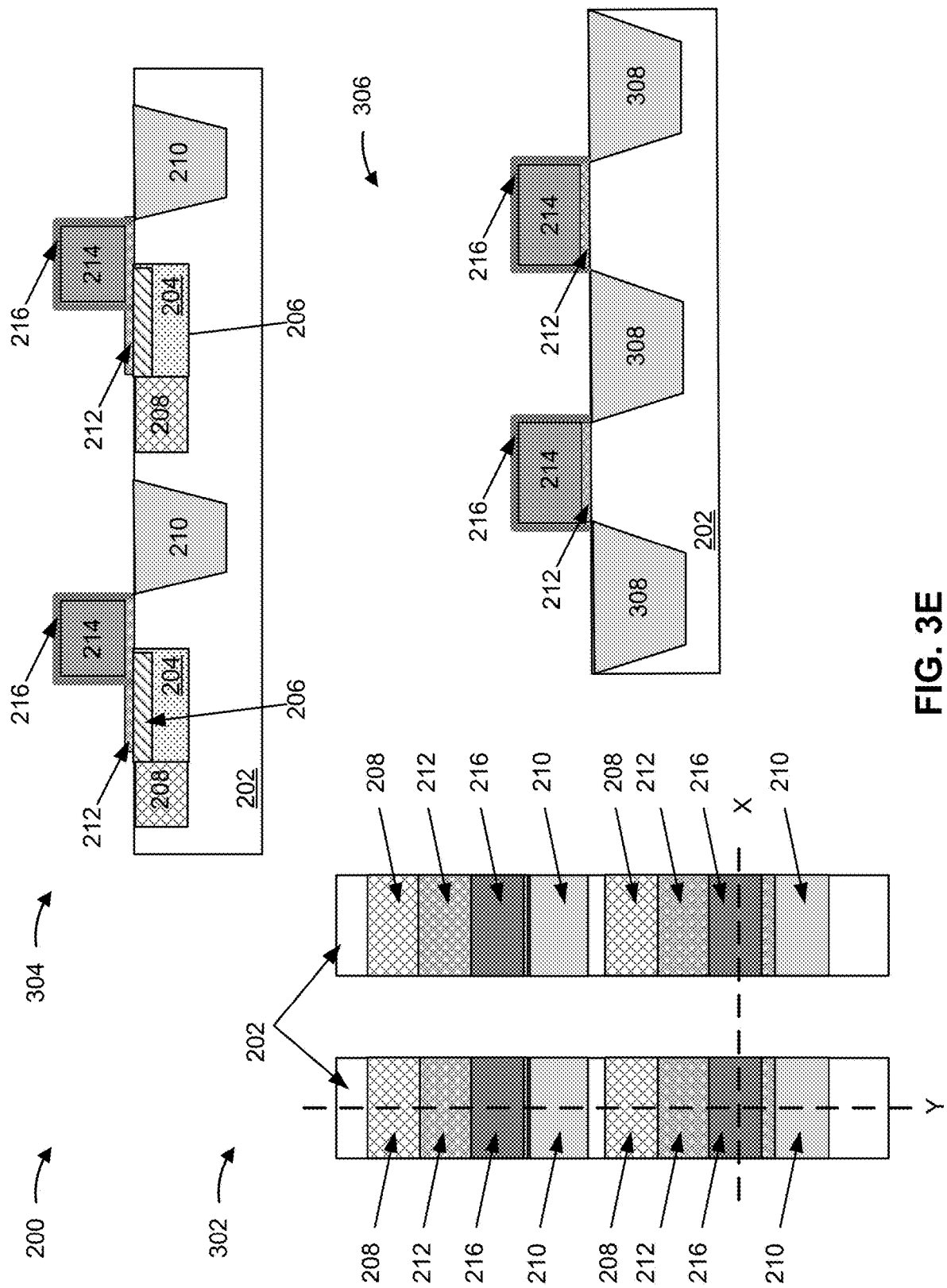

As shown in FIG. 3E, example implementation 300 may include removing a portion of the dielectric structure 216. In some implementations, an etching tool (e.g., etching tool 104) may etch the portion of the dielectric structure 216. As further shown in FIG. 3E, the etching tool may remove a portion of the dielectric structure 216 from a top surface of the substrate 202 (e.g., except along a side surface of the conductive structure 214) and/or from a top surface of the insulating structure 210. In some implementations, a remaining portion of the dielectric structure may be disposed on a top surface and on side surfaces of the conductive structure 214.

Figure 3F:
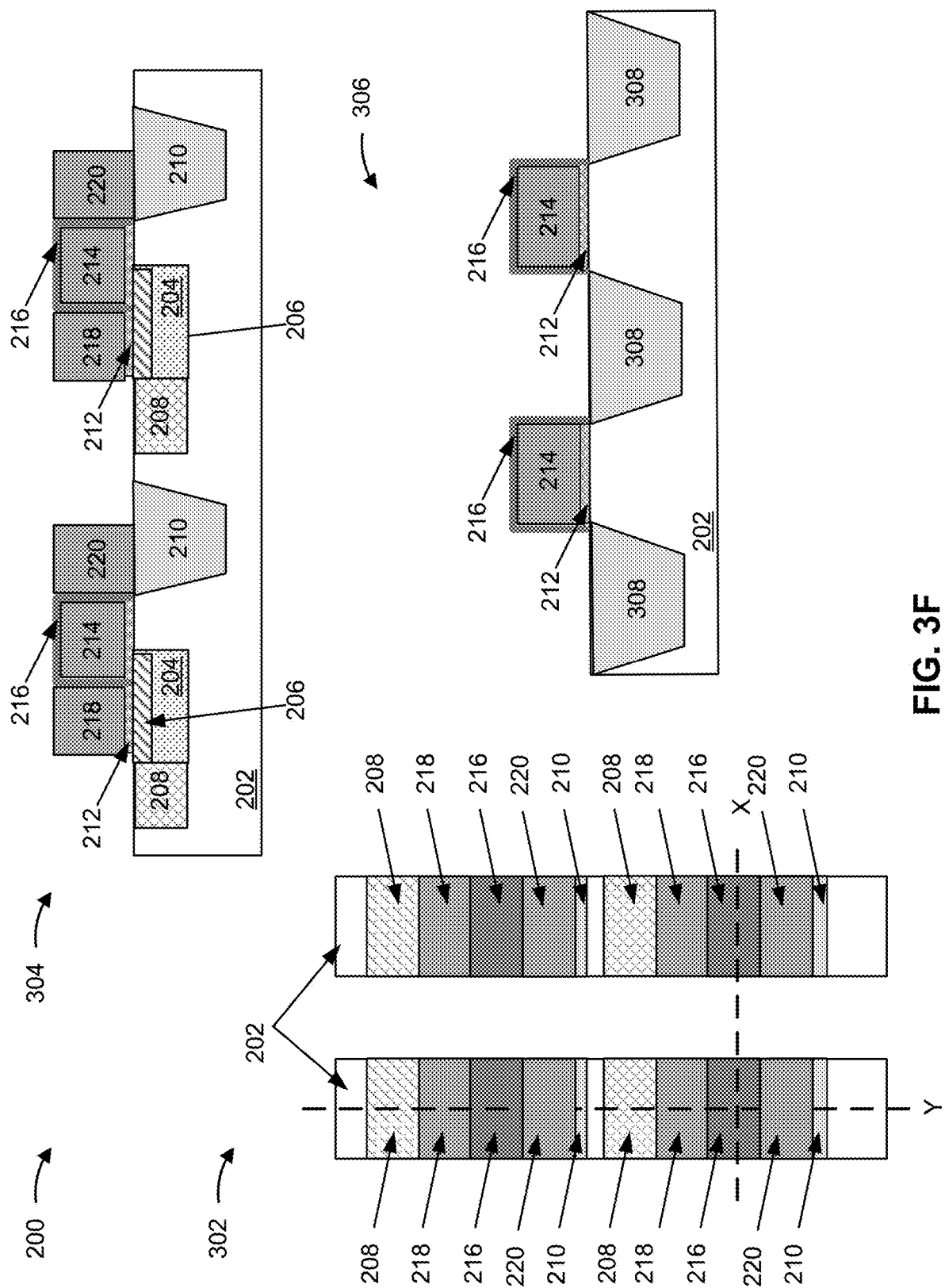

As shown in FIG. 3F, example implementation 300 may include forming a conductive structure 218 (e.g., a gate) and a conductive structure 220 (e.g., a gate) on a portion of the tunneling layer 212 and on the insulating structure 210, respectively. In some implementations, a deposition tool (e.g., deposition tool 102) may deposit the conductive structure 218 on the tunneling layer 212 above the LDD portion 206 and may deposit the conductive structure 220 on the insulating structure 210. The deposition tool may deposit the conductive structures 218 and 220 adjacent to the conductive structure 214 with the dielectric structure 216 disposed between the conductive structures 218 and 220 and the conductive structure 214. In this way, application of different voltages to the conductive structures 214, 218, and 220 may cause the semiconductor structure 200 to perform operations of the semiconductor structure 200, such as programming, erasing, and/or reading.

The dielectric structure 216 may provide an electrically insulating barrier between the conductive structures 214, 218, and 220 to support storage of charges within one or more of the conductive structures 214, 218, or 220, instead of discharging into one of the other conductive structures 214, 218, or 220. In some implementations, deposition of the conductive structures 218 and 220 may be part of a same deposition process (e.g., a set of processes including forming a dielectric layer, forming recesses within the dielectric layer, depositing the conductive structures 218 and 220 into the recesses, and/or removing the dielectric layer). In some implementations, a planarization tool (e.g., planarization tool 106) may polish and/or planarize a top surface of the conductive structures 218 and/or 220 during a deposition process.

Figure 3G:
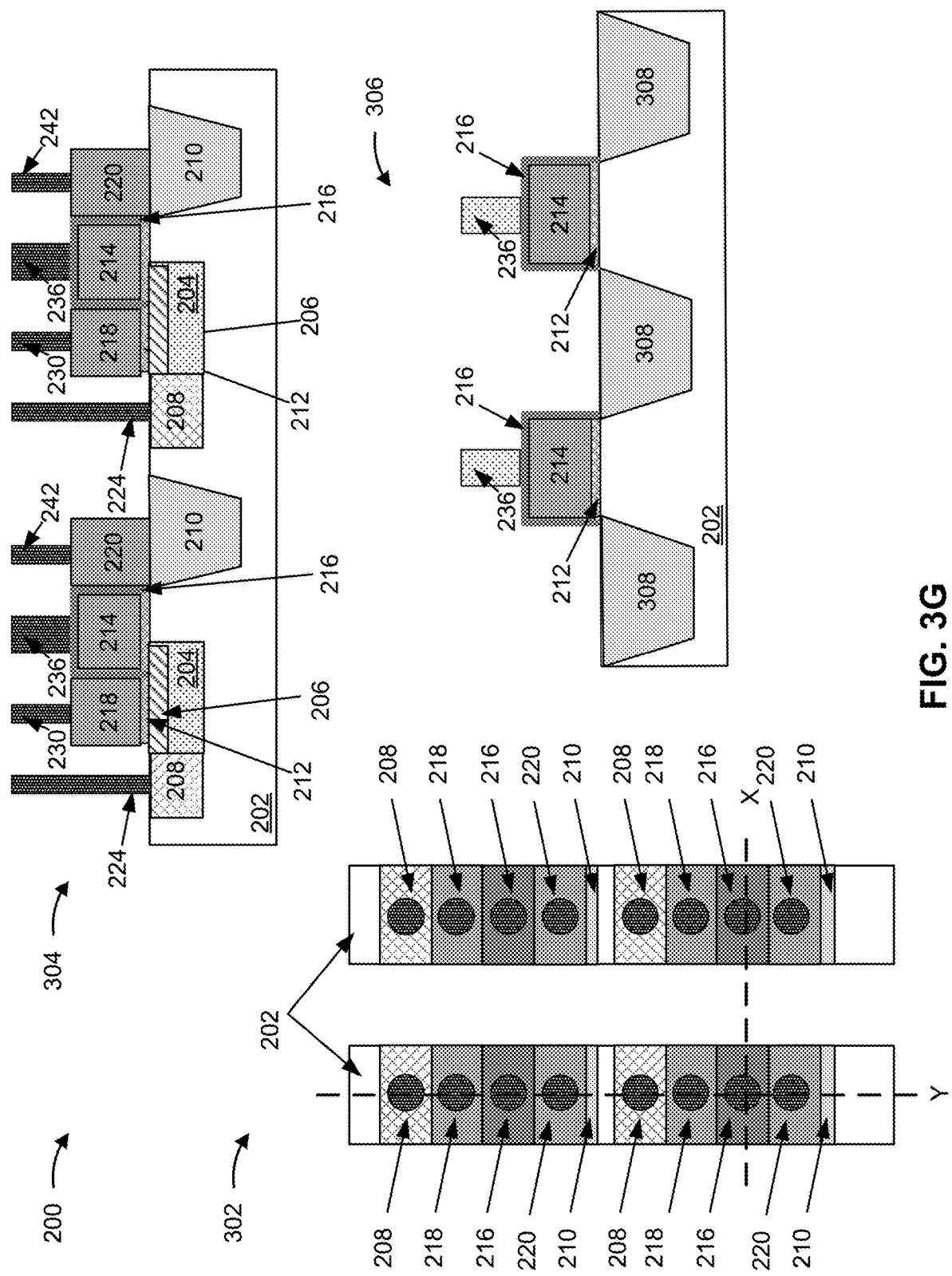

As shown in FIG. 3G, example implementation 300 may include forming conductive structures 224, 230, 236, and 242 on components of the semiconductor structure 200. In some implementations, a deposition tool (e.g., deposition tool 102) may deposit the conductive structure 224 on the source/drain 208, the conductive structure 230 on the conductive structure 218, the conductive structure 236 on the dielectric structure 216, and the conductive structure 242 on the conductive structure 220. The deposition tool may deposit the conductive structures 224, 230, 236, and 242 to provide electrical connections (e.g., electrical pathways) to the components of the semiconductor structure 200. In this way, the semiconductor structure 200 may receive different voltages for the conductive structures 214, 218, and 220 and/or the source/drain 208 to cause the semiconductor structure 200 to perform operations of the semiconductor structure 200, such as programming, erasing, and/or reading.

Figure 3H:
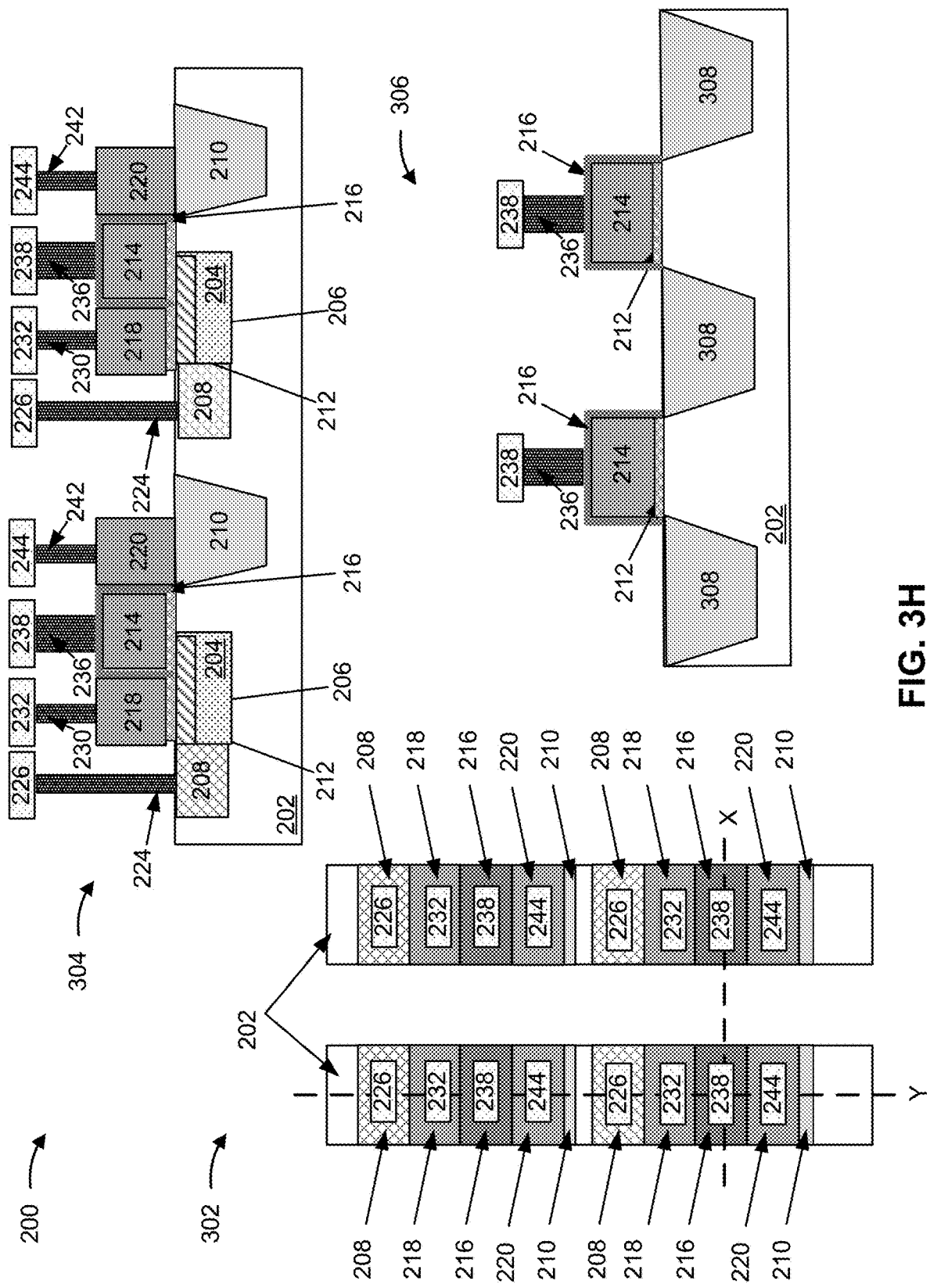

As shown in FIG. 3H, example implementation 300 may include forming conductive structures 226, 232, 238, and 244 on the conductive structures 224, 230, 236, and 242. In some implementations, a deposition tool (e.g., deposition tool 102) may deposit the conductive structure 226 on the conductive structure 224, conductive structure 232 on the conductive structure 230, conductive structure 238 on the conductive structure 236, and conductive structure 244 on the conductive structure 242. The deposition tool may deposit the conductive structures 226, 232, 238, and 244 to provide electrical connections (e.g., electrical pathways) to the conductive structures 224, 230, 236, and 242. In this way, the semiconductor structure 200 may receive different voltages for the conductive structures 214, 218, and 220 and/or the source/drain 208 to cause the semiconductor structure 200 to perform operations of the semiconductor structure 200, such as programming, erasing, and/or reading.

As indicated above, FIGS. 3A-3H are provided as an example. Other examples may differ from what is described with regard to FIGS. 3A-3H. The number and arrangement of devices, layers, and/or materials shown in FIGS. 3A-3H are provided as an example. In practice, there may be additional devices, layers, and/or materials, fewer devices, layers, and/or materials, different devices, layers, and/or materials, or differently arranged devices, layers, and/or materials than those shown in FIGS. 3A-3H. For example, one or more inter-layer dielectric layers or inter-metal dielectric layers may be disposed between structures shown in FIGS. 3A-3H.

Figure 4:
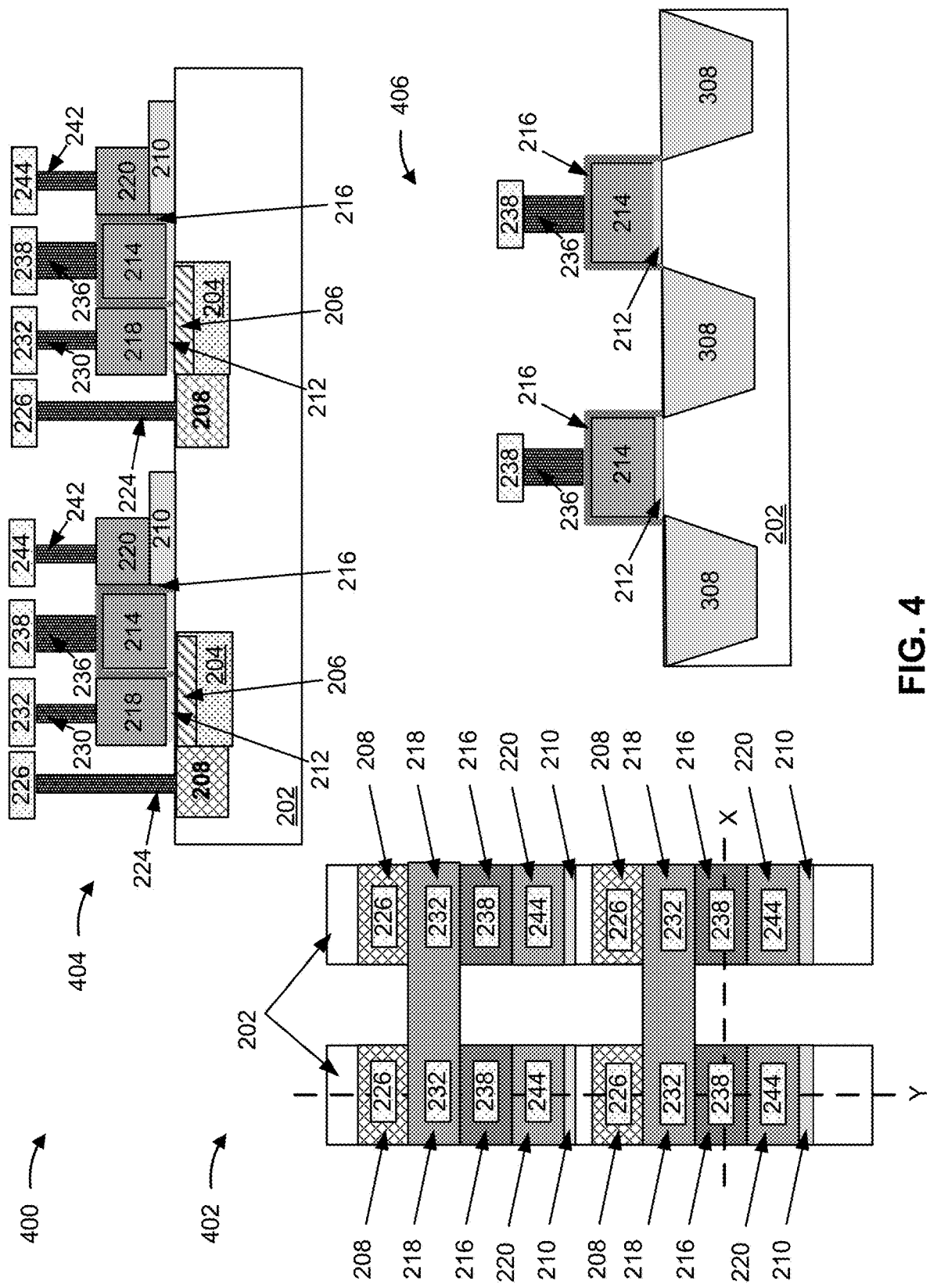
FIG. 4 is a diagram of an example semiconductor structure described herein.

FIG. 4 is a diagram of example semiconductor structure 400 described herein. The semiconductor structure 400 may be formed using a process similar to the process shown in connection with FIGS. 3A-3H, with the insulating structure 210 formed on an upper surface of the substrate 202 instead of formed in a recess of the substrate 202. In some implementations, the semiconductor structure 400 includes one or more layers not shown in FIG. 4, such as one or more barrier layers, adhesion layers, metal gates, substrates, interconnects, recesses (e.g., vias), or semiconductor structures, among other examples. In some implementations, the semiconductor structure 400 includes one or more materials, structures, and/or layers as described herein in connection with FIGS. 2-3H. FIG. 4 includes a top view 402, a Y cross-section view 404, and an X cross-section view 406 of the semiconductor structure 400.

As shown in FIG. 4, the semiconductor structure 400 may include a substrate 202 that includes a doped portion 204, an LDD portion 206, a source/drain 208, and a trench isolation structure 308. The semiconductor structure 400 may include an insulating structure 210 disposed on a top surface of the substrate 202. In some implementations, the insulating structure 210 may provide electrical insulation between a structure above the insulating structure 210 and the substrate 202 below the insulating structure 210. Based on the insulating structure 210 being disposed on the top surface of the substrate 202, a process of forming the semiconductor structure 400 may have a reduced number of operations by avoiding forming a trench structure within the substrate 202.

The semiconductor structure 400 may include a tunneling layer 212 disposed on a top surface of the substrate 202. The semiconductor structure 400 may include a conductive structure 214 formed on a first portion of the tunneling layer 212, a conductive structure 218 formed on a second portion of the tunneling layer 212, and a conductive structure 220 formed on the insulating structure 210. In some implementations, one or more of the conductive structures 218 or 220 may be disposed on top of the trench isolation structure 308 to connect multiple devices of the semiconductor structure 400. This may reduce a number of bit lines that may be required to provide voltages to components of the semiconductor structure 400.

The semiconductor structure 400 may include conductive structures 226, 232, 238, and 244 formed on the conductive structures 224, 230, 236, and 242 to provide electrical connections to the components of the semiconductor structure. In some implementations, the semiconductor structure may omit one or more of conductive structures 226, 232, 238, 244, 224, 230, 236, or 242 based on one or more of the conductive structures 218 or 220 being disposed on top of the trench isolation structure 308 to connect multiple devices of the semiconductor structure 400.

Figure 5:
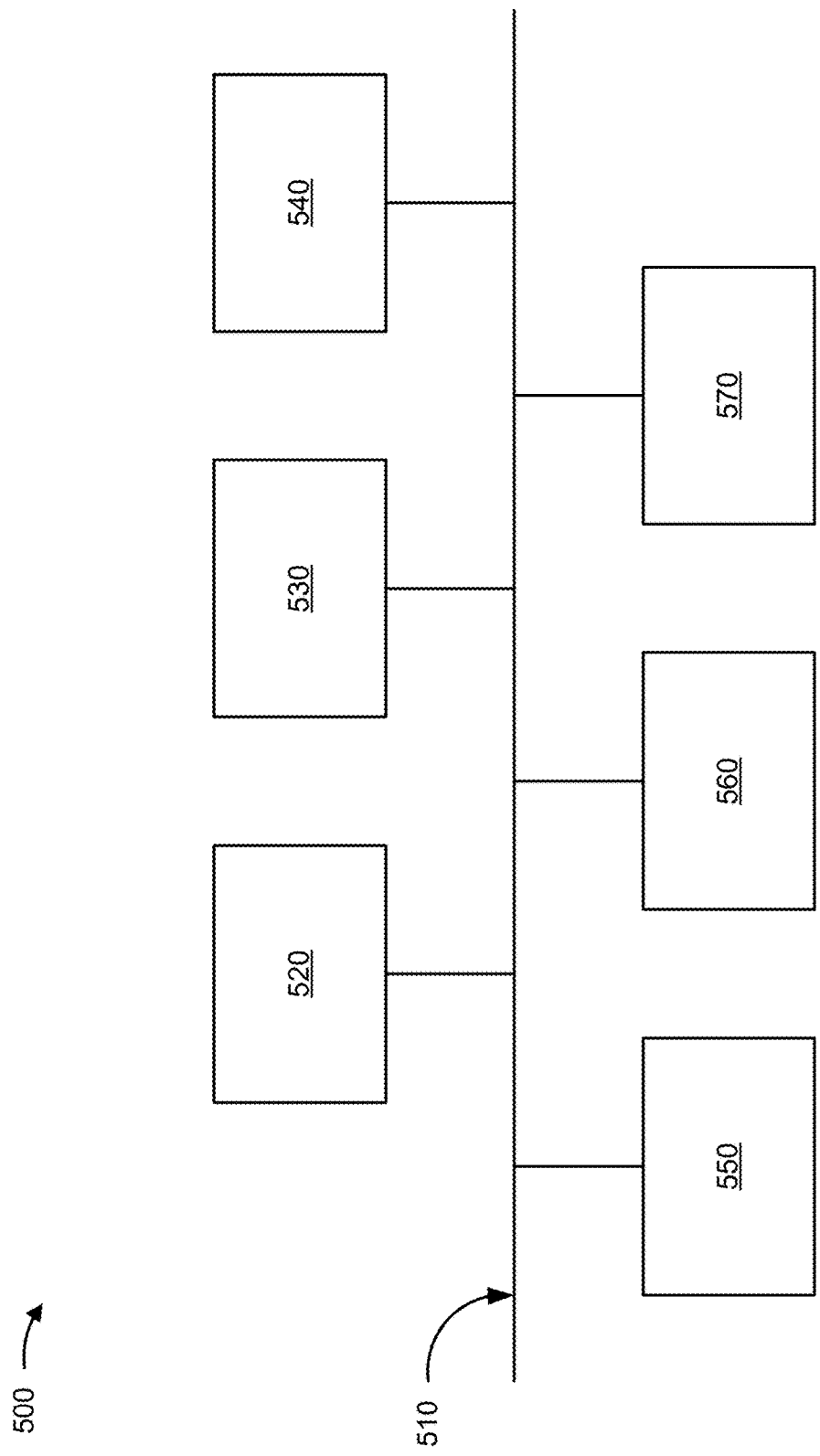
FIG. 5 is a diagram of example components of one or more devices of FIG. 1.

FIG. 5 is a diagram of example components of a device 500, which may correspond to deposition tool 102, etching tool 104, planarization tool 106, ion implantation tool 108, and/or wafer/die transport tool 110. In some implementations, deposition tool 102, etching tool 104, planarization tool 106, ion implantation tool 108, and/or wafer/die transport tool 110 include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
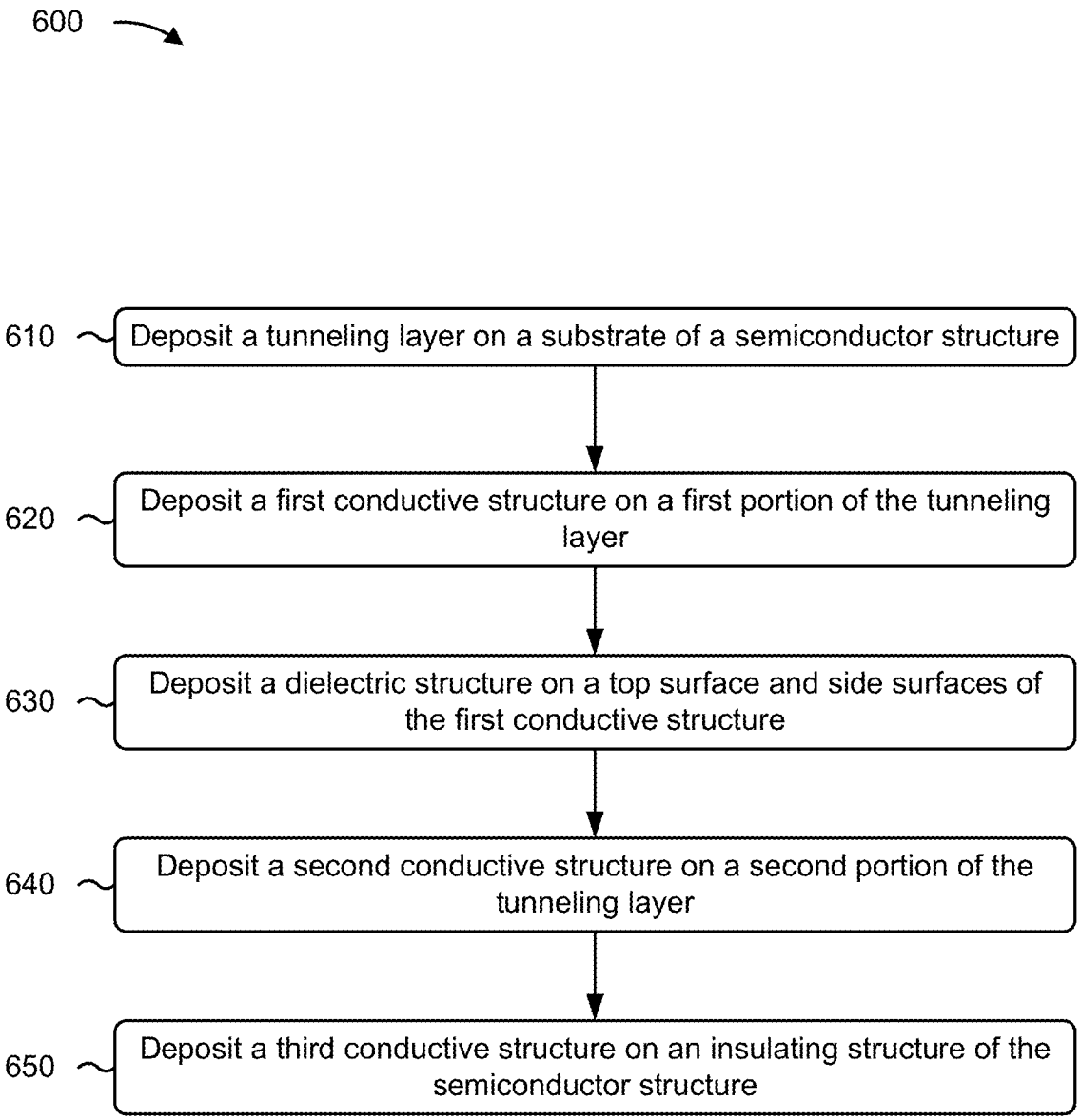
FIG. 6 is a flowchart of an example process relating to forming a semiconductor structure described herein.

FIG. 6 is a flowchart of an example process 600 associated with transistor and method for manufacturing the same. In some implementations, one or more process blocks of FIG. 6 may be performed by a one or more semiconductor processing devices (e.g., deposition tool 102, etching tool 104, planarization tool 106, ion implantation tool 108, and/or wafer/die transport tool 110). Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include depositing a tunneling layer on a substrate of a semiconductor structure, the tunneling layer having a first portion and a second portion (block 610). For example, the one or more semiconductor processing devices may deposit a tunneling layer 212 on a substrate 202 of a semiconductor structure 200, the tunneling layer 212 having a first portion and a second portion, as described above.

As further shown in FIG. 6, process 600 may include depositing a first conductive structure on the first portion of the tunneling layer (block 620). For example, the one or more semiconductor processing devices may deposit a first conductive structure 214 on the first portion of the tunneling layer 212, as described above.

As further shown in FIG. 6, process 600 may include depositing a dielectric structure on a top surface and on side surfaces of the first conductive structure (block 630). For example, the one or more semiconductor processing devices may deposit a dielectric structure 216 on a top surface and on side surfaces of the first conductive structure 214, as described above.

As further shown in FIG. 6, process 600 may include depositing a second conductive structure on the second portion of the tunneling layer, wherein the dielectric structure is disposed between a side surface of the second conductive structure and a first side surface of the first conductive structure (block 640). For example, the one or more semiconductor processing devices may deposit a second conductive structure 218 on the second portion of the tunneling layer 212. In some implementations, the dielectric structure 216 is disposed between a side surface of the second conductive structure 218 and a first side surface of the first conductive structure 214.

As further shown in FIG. 6, process 600 may include depositing a third conductive structure on an insulating structure of the semiconductor structure, wherein the dielectric structure is disposed between a side surface of the third conductive structure and a second side surface of the first conductive structure (block 650). For example, the one or more semiconductor processing devices may deposit a third conductive structure 220 on an insulating structure 210 of the semiconductor structure 200, as described above. In some implementations, the dielectric structure 216 is disposed between a side surface of the third conductive structure 220 and a second side surface of the first conductive structure 214.

Process 600 may include additional implementations, such as any single implementation or any combination of implementations described below and/or in connection with one or more other processes described elsewhere herein.

In a first implementation, process 600 includes forming a source/drain on the substrate that is laterally displaced from the first conductive structure, the second conductive structure, and the third conductive structure.

In a second implementation, alone or in combination with the first implementation, process 600 includes forming, before depositing the third conductive structure, a recess within the substrate, and depositing the insulating structure within the recess.

In a third implementation, alone or in combination with one or more of the first and second implementations, process 600 includes forming, before depositing the tunneling layer on the substrate, a lightly doped drain within the substrate, wherein depositing the tunneling layer on the substrate comprises depositing the second portion of the tunneling layer on the lightly doped drain.

In a fourth implementation, alone or in combination with one or more of the first through third implementations, depositing the dielectric structure on the top surface and the side surfaces of the first conductive structure comprises depositing a portion of the dielectric structure on a side surface of the first conductive structure, wherein a bottom surface of the portion of the dielectric structure is disposed on the insulating structure.

In a fifth implementation, alone or in combination with one or more of the first through fourth implementations, process 600 includes forming a fourth conductive structure configured to couple the first conductive structure to a first voltage source, the fourth conductive structure having a first width, forming a fifth conductive structure configured to couple the second conductive structure to a second voltage source, the fifth conductive structure having a second width, and forming a sixth conductive structure configured to couple the third conductive structure to a third voltage source, the sixth conductive structure having a third width, wherein the second width is greater than the first width and the third width.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a semiconductor structure may include gates having heights that are relatively low, which may improve deposition processes (e.g., reduce errors, cost, and/or cycle times) based on the gates having a same or similar height as other single-layer devices within the semiconductor structure (e.g., a logic device using a same material as the gates). Additionally, based on the gates being arranged laterally with different terminals, the semiconductor structure may be configured to perform one or more operations based on providing a voltage difference across a dielectric structure, instead of based on providing a voltage difference across a tunneling layer. This may reduce stress on the tunneling layer, which may increase a life cycle of the semiconductor structure.

As described in greater detail above, some implementations described herein provide a semiconductor structure. The semiconductor structure includes a first terminal coupled to a substrate of the semiconductor structure, with the first terminal including a first portion of a tunneling layer formed on the substrate and a first conductive structure formed on the first portion of the tunneling layer. The semiconductor structure includes a second terminal coupled to the substrate, with the second terminal including a second portion of the tunneling layer formed on the substrate, a second conductive structure formed on the second portion of the tunneling layer, and a dielectric structure formed on the second conductive structure and between the first conductive structure and the second conductive structure. The semiconductor structure includes a third terminal coupled to an insulating structure of the semiconductor structure, with the third terminal including a third conductive structure formed on the insulating structure of the semiconductor structure, where the dielectric structure is disposed between the second conductive structure and the third conductive structure.

As described in greater detail above, some implementations described herein provide a semiconductor structure. The semiconductor structure includes a first terminal coupled to a substrate of the semiconductor structure, with the first terminal including a first portion of a tunneling layer formed on the substrate, and a first gate formed on the first portion of the tunneling layer. The semiconductor structure includes a second terminal coupled to the substrate and adjacent to the first terminal, with the second terminal including a second portion of the tunneling layer formed on the substrate, a second gate formed on the second portion of the tunneling layer, and a dielectric structure formed on a top surface and side surfaces of the second gate. The semiconductor structure includes a third terminal coupled to an insulating structure of the semiconductor structure and adjacent to the second terminal, with the third terminal including, a third gate formed on the insulating structure. The semiconductor structure includes a fourth terminal coupled to a source/drain of the semiconductor structure.

As described in greater detail above, some implementations described herein provide a method. The method includes depositing a tunneling layer on a substrate of a semiconductor structure, with the tunneling layer having a first portion and a second portion. The method includes depositing a first conductive structure on the first portion of the tunneling layer. The method also includes depositing a dielectric structure on a top surface and on side surfaces of the first conductive structure. The method additionally includes depositing a second conductive structure on the second portion of the tunneling layer, where the dielectric structure is disposed between a side surface of the second conductive structure and a first side surface of the first conductive structure. The method further includes depositing a third conductive structure on an insulating structure of the semiconductor structure, where the dielectric structure is disposed between a side surface of the third conductive structure and a second side surface of the first conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    depositing a tunneling layer on a substrate of a semiconductor structure, the tunneling layer having a first portion and a second portion;
    depositing a first conductive structure on the first portion of the tunneling layer;
    depositing a dielectric structure on a top surface and on side surfaces of the first conductive structure;
    depositing a second conductive structure on the second portion of the tunneling layer,
        wherein the dielectric structure is disposed between a side surface of the second conductive structure and a first side surface of the side surfaces of the first conductive structure;
    depositing a third conductive structure on an insulating structure of the semiconductor structure,
        wherein the dielectric structure is disposed between a side surface of the third conductive structure and a second side surface of the side surfaces of the first conductive structure; and
    forming, before depositing the tunneling layer on the substrate, a lightly doped drain within the substrate,
        wherein depositing the tunneling layer on the substrate comprises depositing the second portion of the tunneling layer on the lightly doped drain.

2. The method of claim 1, further comprising:
    forming a source/drain on the substrate that is laterally displaced from the first conductive structure, the second conductive structure, and the third conductive structure.

3. The method of claim 1, further comprising:
    forming, before depositing the third conductive structure, a recess within the substrate; and
    depositing the insulating structure within the recess.

4. The method of claim 1,
    wherein depositing the dielectric structure on the top surface and the side surfaces of the first conductive structure comprises:
        depositing a portion of the dielectric structure on a side surface of the side surfaces of the first conductive structure, wherein a bottom surface of the portion of the dielectric structure is disposed on the insulating structure.

5. The method of claim 1, further comprising:
    forming a fourth conductive structure configured to couple the first conductive structure to a first voltage source, the fourth conductive structure having a first width;

forming a fifth conductive structure configured to couple the second conductive structure to a second voltage source, the fifth conductive structure having a second width; and forming a sixth conductive structure configured to couple the third conductive structure to a third voltage source, the sixth conductive structure having a third width, wherein the first width is greater than the second width and the third width.

6. A method, comprising:

forming a substrate that includes a lightly doped drain portion and a doped portion directly under the lightly doped drain portion, wherein the doped portion has a conductivity that is higher than a conductivity of the lightly doped drain portion;

depositing a tunneling layer on the substrate, the tunneling layer having a first portion and a second portion;

depositing a first conductive structure on the first portion of the tunneling layer, wherein the first conductive structure is disposed over at least a portion of the lightly doped drain portion;

depositing a dielectric structure on a top surface and on side surfaces of the first conductive structure;

depositing a second conductive structure on the second portion of the tunneling layer, wherein the dielectric structure is disposed between a side surface of the second conductive structure and a first side surface of the first conductive structure, and wherein the second conductive structure is disposed over at least a portion of the lightly doped drain portion; and depositing a third conductive structure on an insulating structure, wherein the dielectric structure is disposed between a side surface of the third conductive structure and a second side surface of the first conductive structure.

7. The method of claim 6, further comprising:

forming a source/drain on the substrate, wherein the doped portion is adjacent to the source/drain.

8. The method of claim 6, wherein the insulating structure comprises:
a shallow trench isolation structure,
a deep trench isolation structure, or
an insulating material disposed on a top surface of the substrate.

9. The method of claim 6, wherein the first conductive structure, the third conductive structure, and a top portion of the dielectric structure extend to approximately a same height relative to a top surface of the substrate.

10. The method of claim 6, wherein an electrical resistance of the insulating structure is greater than an electrical resistance of the dielectric structure.

11. The method of claim 6, further comprising:

forming a fourth conductive structure coupled to a source/drain, wherein the fourth conductive structure is above the source/drain.

12. The method of claim 6, further comprising:

forming a first electrical connector above the first conductive structure;

forming a second electrical connector above the dielectric structure; and forming a third electrical connector above the third conductive structure.

13. The method of claim 12, wherein the second electrical connector is at a same level as the first electrical connector and the third electrical connector.

14. A method, comprising:

forming a lightly doped drain portion of a substrate of a semiconductor structure;

forming a doped portion of the substrate directly under the lightly doped drain portion, wherein the doped portion has a conductivity that is higher than a conductivity of the lightly doped drain portion;

forming a first conductive structure over at least a portion of the lightly doped drain portion;

forming a second conductive structure over at least a portion of the lightly doped drain portion;

forming a third conductive structure on an insulating structure;

forming a dielectric structure between the second conductive structure and the first conductive structure and between the first conductive structure and the third conductive structure; and depositing a tunneling layer on the substrate, the tunneling layer having a first portion and a second portion, wherein at least the second portion of the tunneling layer is deposited on the lightly doped drain portion.

15. The method of claim 14, wherein the doped portion is adjacent to a source/drain that is on the substrate.

16. The method of claim 14, wherein the first conductive structure and the third conductive structure have approximately a first height.

17. The method of claim 16, wherein the dielectric structure has approximately the first height.

18. The method of claim 14, further comprising:

forming a fourth conductive structure configured to couple the first conductive structure to a first voltage source;

forming a fifth conductive structure configured to couple the second conductive structure to a second voltage source; and forming a sixth conductive structure configured to couple the third conductive structure to a third voltage source.

19. The method of claim 14, wherein the first conductive structure is on the first portion of the tunneling layer, and wherein the second conductive structure is on the second portion of the tunneling layer.

20. The method of claim 14, wherein depositing the tunneling layer on the substrate further comprises depositing part of the first portion of the tunneling layer on the lightly doped drain.

* * * * *